United States Patent
Pigott et al.

(10) Patent No.: US 10,812,080 B2
(45) Date of Patent: Oct. 20, 2020

(54) HIGH SPEED VOLTAGE LEVEL TRANSLATOR INCLUDING AN AUTOMATICALLY BOOTSTRAPPED CASCODE DRIVER

(71) Applicant: NXP USA, Inc., Austin, TX (US)

(72) Inventors: John Pigott, Phoenix, AZ (US); Trevor Mark Newlin, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/189,424

(22) Filed: Nov. 13, 2018

(65) Prior Publication Data

US 2020/0153420 A1 May 14, 2020

(51) Int. Cl.
*H03K 3/012* (2006.01)
*H03K 19/0175* (2006.01)
*H03K 19/0185* (2006.01)

(52) U.S. Cl.
CPC ..... *H03K 19/018507* (2013.01); *H03K 3/012* (2013.01); *H03K 19/017509* (2013.01)

(58) Field of Classification Search
CPC .............. H03K 3/012; H03K 19/0175; H03K 19/017509; H03K 19/0185; H03K 19/018507; H03K 19/018514; H03K 19/018521; H03K 19/018528
USPC ...................................... 326/80, 81; 327/333
See application file for complete search history.

(56) References Cited

U.S. PATENT DOCUMENTS

| | | | |
|---|---|---|---|
| 3,631,267 A * | 12/1971 | Heimbigner | H03K 5/023 326/88 |
| 5,502,406 A | 3/1996 | Traynor et al. | |
| 5,969,542 A | 10/1999 | Maley et al. | |
| 6,404,229 B1 | 6/2002 | Barnes | |
| 6,642,769 B1 | 11/2003 | Chang et al. | |
| 7,816,969 B2 | 10/2010 | Yoo | |
| 2007/0279091 A1 * | 12/2007 | Goel | H03K 3/356147 326/71 |
| 2010/0109744 A1 | 5/2010 | Czech et al. | |
| 2013/0222037 A1 | 8/2013 | Zhang et al. | |
| 2016/0013730 A1 | 1/2016 | Neri | |

FOREIGN PATENT DOCUMENTS

| | | |
|---|---|---|
| DE | 102009019124 A1 | 11/2010 |
| EP | 2184853 A2 | 5/2010 |
| EP | 2184853 A3 | 5/2010 |

* cited by examiner

*Primary Examiner* — William Hernandez
(74) *Attorney, Agent, or Firm* — Charlene R. Jacobsen

(57) ABSTRACT

A method for high-speed voltage level translation includes biasing a high-voltage (HV) gate of an HV transistor to an intermediate voltage with a bias device. A low-voltage (LV) transistor is activated with a positive voltage transition applied to an LV gate of the LV transistor, wherein the HV transistor is connected in series between an output and an LV drain of the LV transistor. The intermediate voltage is bootstrapped to a bootstrapped voltage in response to the positive voltage transition on the LV gate coupled to the HV gate through a capacitor therebetween. The output is discharged. A time constant, defined by a resistance of the bias device and a capacitance of the capacitor, is greater than a minimum time constant, thereby maintaining the bootstrapped voltage on the HV gate at or above a drive voltage for a minimum period to discharge the output to a minimum voltage.

8 Claims, 4 Drawing Sheets

HIGH SPEED VOLTAGE LEVEL TRANSLATOR INCLUDING AN AUTOMATICALLY BOOTSTRAPPED CASCODE DRIVER

FIELD

This disclosure relates generally to voltage level translation, and more specifically to high-speed voltage level translation with an automatically bootstrapped cascode driver.

BACKGROUND

Many mixed-signal integrated circuits (ICs) require voltage level translation (e.g., level shifters) between different voltage domains. In particular, ICs containing DC/DC voltage converters will typical require logic signals from a low voltage domain to be shifted in amplitude to communicate with circuits in a higher voltage domain. Voltage level translation is also frequently used to interface different logic circuits operating with different supply voltages to balance speed and power consumptions objectives. Furthermore, analog circuits often use higher supply voltages for more precise operation having improved signal to noise ratios for example.

Voltage level translation between different voltage domains introduces various design challenges. The lower voltage circuits may require isolation from higher voltages to prevent being damaged. Higher voltage circuits often are larger in area and cost and have higher gate capacitance, which reduces speed. In addition, translating between low voltage and high voltage domains has traditionally involved continuous current direct current (DC) bias paths and slow signal slew rates.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for a high-speed voltage level translator including an automatically bootstrapped low voltage to high voltage driver. This driver combines a high-voltage (HV) and a low-voltage (LV) switch in a cascode arrangement. In one embodiment, the LV switch is driven by standard logic level signals. The HV switch cascodes the LV switch and is automatically bootstrapped from the same logic level signal that drives the LV switch.

Existing level shifters have inherent delays due to the use of large HV devices having high input and output capacitance. The level shifter embodiments disclosed herein mitigate the slow speed and the timing variability inherent in traditional shifters by generating a bias on the HV switch without DC current consumption, which is further bootstrapped in response to an input transition. The new level shifter embodiments in this disclosure allow a reduction in overall delay (e.g., transit delay and slew rate), and timing variability in part by enabling the reduction of the parasitic and gate capacitances of both the LV transistor and the HV transistor. In some embodiments, the new level shifter has reduced a delay by 50% compared to when a traditional level shifter is used.

Advantageously, the reduction in capacitance of the LV and HV transistors, the dynamic bootstrapping and the bias control result in a reduction in overall charge consumption and supply noise during switching events. High performance DC/DC converters use voltage level translators to convert between low voltage and high voltage domains for power stage drivers, diagnostics, configuration control and fault detection for example. In an example embodiment, the propagation delay of the new level shifter improves DC/DC conversion efficiency through dead-time control (e.g., the time required to switch between operating a pull-up and a pull-down device to prevent cross-conduction from the supply to ground). Furthermore, the new level shifter improves loop response of control systems by reducing excessive phase delay.

Figure 1:
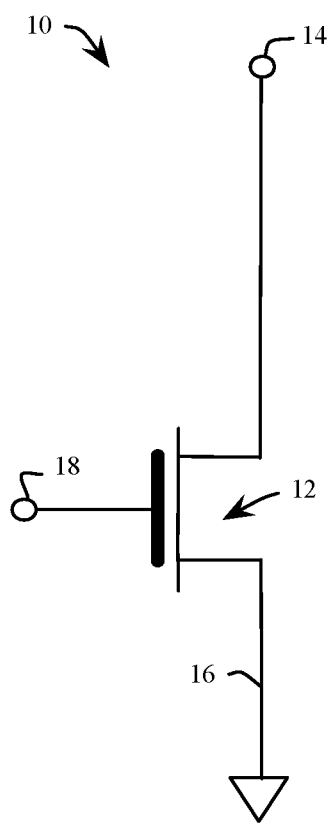
FIG. 1 is a schematic view of an embodiment of a high voltage transistor for translating voltage levels.

FIG. 1 shows an embodiment 10 of a traditional voltage level translator. The embodiment 10 includes an HV transistor 12 having a drain connected to an output 14, a source connected to a ground 16 and a gate connected to an input 18. A dominant cause of delay in traditional level shifters is due to the limited drive of cross-coupled HV P-channel Field Effect Transistors (FETs) or PFETs resulting from limitations of the low-side HV N-channel FETs (NFETs). The low-side NFETs are controlled with a relatively lower logic-voltage signal at the input 18 and are required to discharge a higher voltage signal at the output 14 through one leg of the cross-coupled HV PFETs. Consequently, the HV transistor 12 requires a wider channel width, which increases gate capacitance. Achieving high-speed voltage translation imposes conflicting requirements of a large HV transistor 12 (e.g., with a wide channel width), yet with low input and output capacitance.

Figure 2:
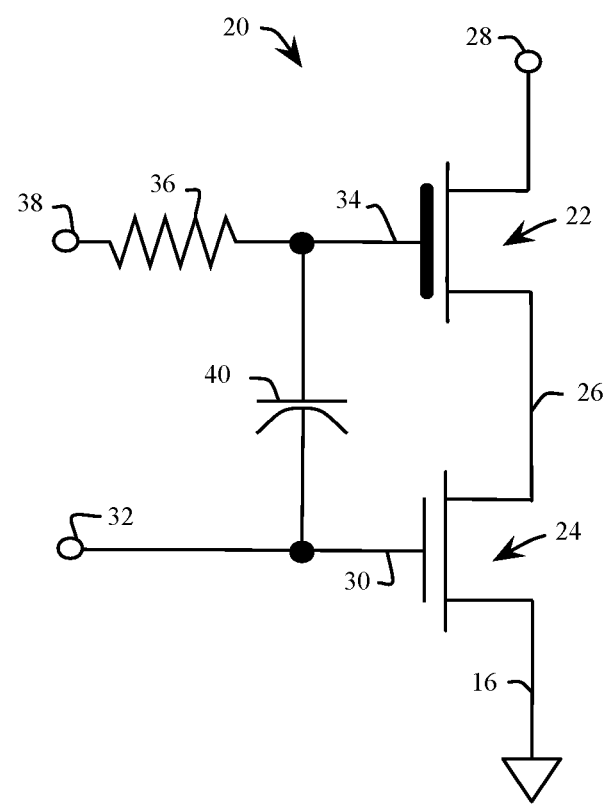
FIG. 2 is a schematic view of an automatically bootstrapped cascode driver in accordance with an example embodiment of the present disclosure.

Referring to FIG. 2, in contrast to FIG. 1, a single large HV FET is replaced with a cascoded transistor pair including automatic bootstrapping and biasing without DC conduction. Specifically, the embodiment 20 includes a source of an HV NFET 22 connected to drain of an LV NFET 24 at node 26. The source of the LV NFET 24 is connected to a ground 16. In example embodiments, the ground 16 is a DC source to which the input and output signals are referenced, and need not be zero volts. The drain of the HV NFET 22 is connected to an output 28. An LV gate 30 of the LV NFET 24 is connected to an input 32. An HV gate 34 of the HV NFET 22 is connected to a bias device 36, which is connected to a bias voltage 38. A capacitor 40 connects the LV gate 30 of the LV NFET 24 to the HV gate 34 of the HV NFET 22.

The embodiment 20 replaces the traditional slower and larger HV NFET 12 of FIG. 1 with a cascode of a smaller HV NFET 22 and a small LV NFET 24. The LV NFET 24 is driven optimally with a low voltage (e.g., logic level) signal, and the HV NFET 22 is driven with a dynamic "intermediate voltage" signal of approximately twice the logic level signal by bootstrapping with a small capacitor 40. The intermediate voltage on the HV gate 34 of the HV NFET 22 is developed by biasing the HV gate 34 to a DC level and modifying the DC level to a transient voltage by bootstrapping a positive voltage transition on the input 32.

In one example, the logic level signal is nominally 1.5V, and the bias voltage 38 is also 1.5V derived from the supply voltage used to generate the logic level signal. In response to a positive voltage transition on the input 32, the HV gate 34 will bootstrap from 1.5V to substantially 3.0V. In one example embodiment, the bootstrapping the HV gate 34 increased the drive current to a PFET cross-coupled pair connected to the output 28 by ten times compared to the traditional embodiment 10. This increase in drive current, combined with reduced capacitance on the input 32 (from a smaller gate area) and the output 28 (from a smaller drain area) significantly increases the voltage translation speed, without adding DC current.

In one embodiment, the intermediate voltage is chosen to operate the HV NFET 22 in a source follower mode while waiting for a positive voltage transition on the input 32. Accordingly, a voltage on the node 26 charges to approximately one threshold voltage (of the HV NFET 22) below the intermediate voltage, well within the operating voltage range of the LV NFET 24. When a positive voltage transition is applied to the input 32, the LV NFET 24 activates, at least partially discharges, and clamps the node 26 while the intermediate voltage on the HV gate 34 is bootstrapped to a bootstrapped voltage. The LV NFET 24 activates faster than the HV NFET 22 because the LV NFET 24 has a lower threshold voltage than the HV NFET 22. Clamping the node 26 protects the LV NFET 24 against drain to source breakdown (e.g., BVDSS).

In an example embodiment, the bias device 36 is a resistor. In another embodiment, the bias device 36 is a PFET having a gate biased to ground. In another embodiment, the bias device is a PFET having a grounded gate, a drain connected to an LV supply used for logic circuits, and a source and bulk connected to the HV gate 34. In another embodiment a resistor is connected in series with a PFET to form the bias device 36.

In one example, the embodiment 20 of the voltage level shifter is implemented in 0.13 micron CMOS technology, the LV transistor 24 has a gate width and length of 2.0 microns and 0.15 microns respectively, the HV transistor 22 has a gate width and length of 4.0 microns and 0.64 microns respectively, the capacitor has a capacitance of 100 femtofarads, the bias device has a resistance of 25.7 kohms, and an input voltage of 1.5V at the input 32 is shifted to a voltage of 5V at the output 28 with the embodiment 20 connected to a pair of cross-coupled PFETs. In contrast, the HV transistor 12 in the embodiment 10 of FIG. 1 has a gate width and length of 10.0 microns and 0.64 microns respectively.

Figure 3:
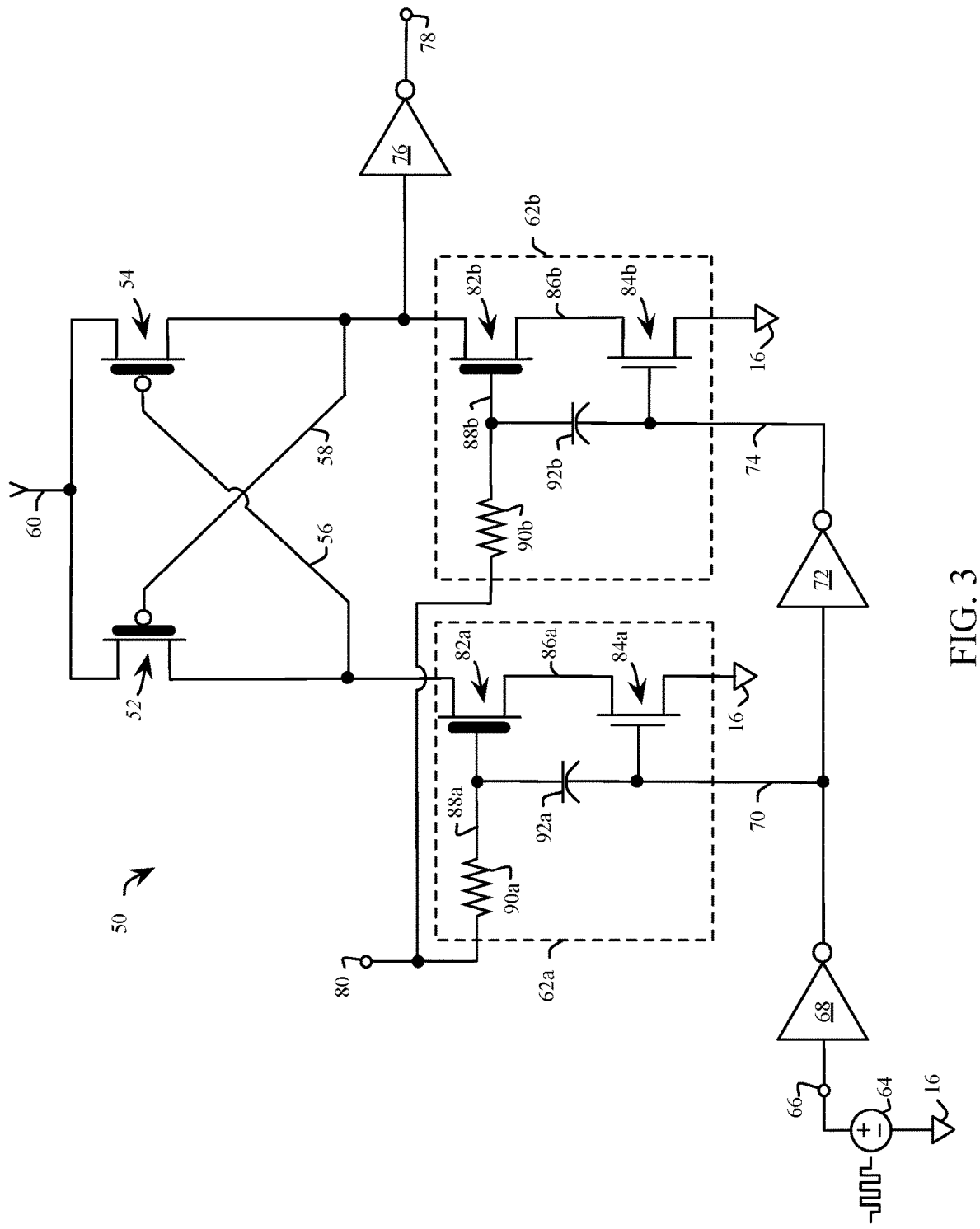
FIG. 3 is a schematic view of a high-speed voltage level translator including an automatically bootstrapped cascode driver in accordance with an example embodiment of the present disclosure.

FIG. 3 shows an embodiment 50 of a high-speed voltage level translator with a cross-coupled pair of PFETs including a first PFET 52 and a second PFET 54. A drain of the first PFET 52 and a gate of the second PFET 54 are connected at a node 56. A drain of the second PFET 54 and a gate of the first PFET 52 are connected at a node 58. The source of the first PFET 52 and the second PFET 54 are each connected to an HV supply 60. The node 56 is connected to a first voltage driver 62a. The node 58 is connected to a second voltage driver 62b.

In an example embodiment, the first voltage driver 62a and the second voltage driver 62b are the same design as the embodiment 20 of FIG. 2, including one of the aforementioned variations to the bias device 36. In another embodiment, only one of the first voltage driver 62a and the second voltage driver 62b is the same design as the embodiment 20 of FIG. 2, including the aforementioned variations to the bias device 36, while the other voltage driver is based on the embodiment 10 of FIG. 1. For example, in one embodiment one of the voltage drivers 62a or 62b is replaced with the embodiment 10 in an embodiment of an asymmetric high-speed voltage level translator when it is desired to reduce circuit complexity and when only one transition polarity requires fast speed (e.g., either a positive or a negative voltage transition on the respective inputs 32 of the voltage drivers 62a and 62b).

In the embodiment 50, a signal source 64 is connected between a node 66 and the ground 16. The signal source is a signal from an LV domain or a "logic level signal" such as an enable signal, a data signal and the like. In one embodiment, the signal at node 66 is inverted by an inverter 68 to generate an input signal on the input node 70 connected to the first voltage driver 62a. The signal on the input node 70 is inverted by the inverter 72 to generate an input signal on the input node 74 connected to a second voltage driver 62b. An inverter 76 inverts an output from node 58 to generate an output 78.

With reference to FIG. 3 and FIG. 2, the first voltage driver 62a and the second voltage driver 62b each comprise an HV NFET 82a and 82b respectively, connected to an LV NFET 84a and 84b respectively at a node 86a and 86b respectively. An LV gate of the LV NFETS 84a and 84b are connected to respective input nodes 70 and 74. Capacitors 92a and 92b are connected between the LV NFET 84a and HV NFET 82a and between the LV NFET 84b and HV NFET 82b respectively. The HV gate 88a of HV transistor 82a and HV gate 88b of the HV transistor 82b are connected to respective bias devices 90a and 90b. Each of the bias devices 90a and 90b are connected to a bias voltage 80. In one embodiment, the bias voltage 80 is the LV supply. In another embodiment, the bias voltage is determined by a reliability limit (e.g., breakdown or avalanche current limit) of a respective LV transistor 84a and 84b, wherein the reliability limit is less than one threshold of the respective HV transistor 82a and 82b below an intermediate voltage established by the bias voltage, while the LV transistor 84a or 84b is off.

In one example of an operation of the embodiment 50, a positive voltage transition at the node 66 will cause the first voltage driver 62a to deactivate and the second voltage driver 62b to activate, thereby discharging node 58 towards the ground 16 and causing a positive voltage transition on output 78. In one embodiment, the inverters 68 and 72 comprise an LV PFET connected in series with an LV NFET and powered by an LV supply. The inverter 76 comprises an HV PFET connected in series with an HV NFET and powered by the HV supply 60.

In another embodiment, the input nodes 70 and 74 are driven directly by a variety of circuits, including but not limited to NAND gates, NOR gates, flip-flops, latches and the like. In another embodiment, the input nodes 70 and 74 form a differential input. In another embodiment, inverters 68 and 76 are removed, wherein the input node 70 is directly driven by the signal source 64. In another embodiment, the inverter 72 is removed and the input node 74 is driven directly by the signal source 64. In another embodiment, the inverter 72 is removed and the input node 74 is driven by the signal source 64 buffered by a buffer.

Figure 4:
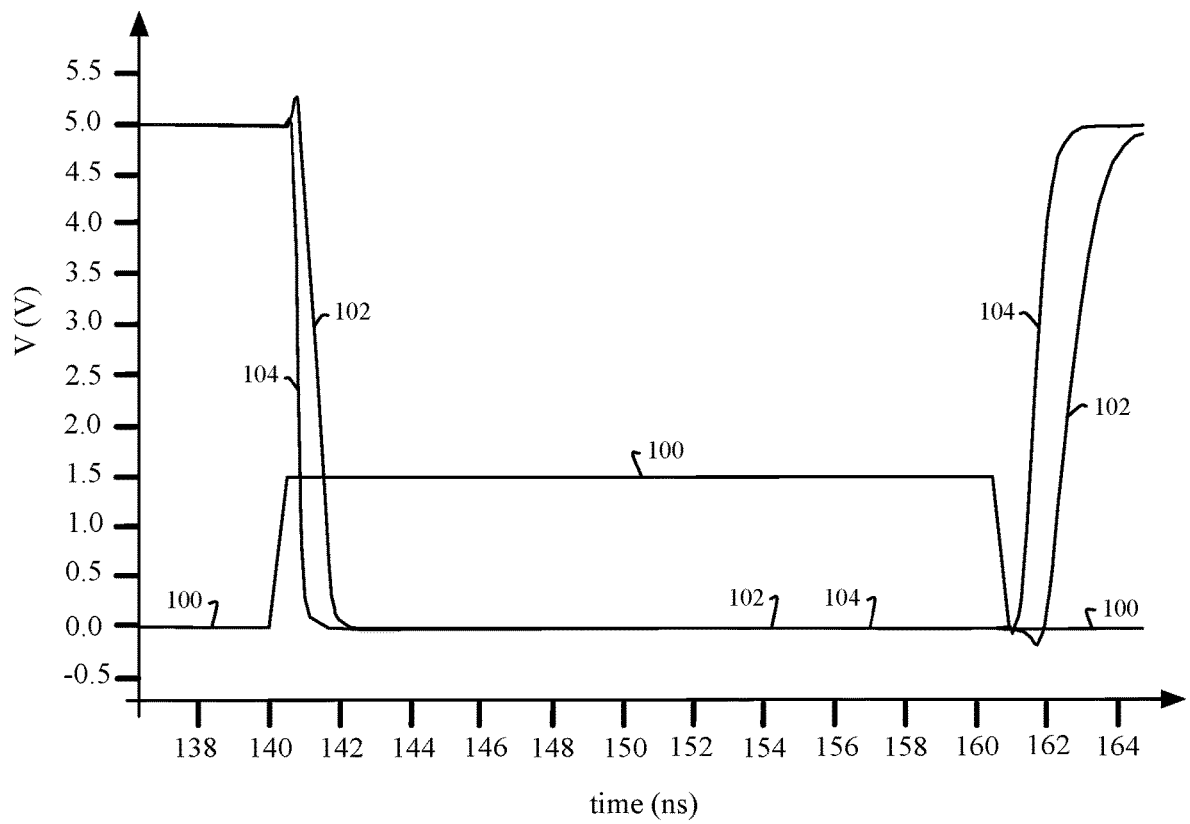
FIG. 4 is a graphical view of timing waveforms according to the embodiment of FIG. 3.
Figure 5:
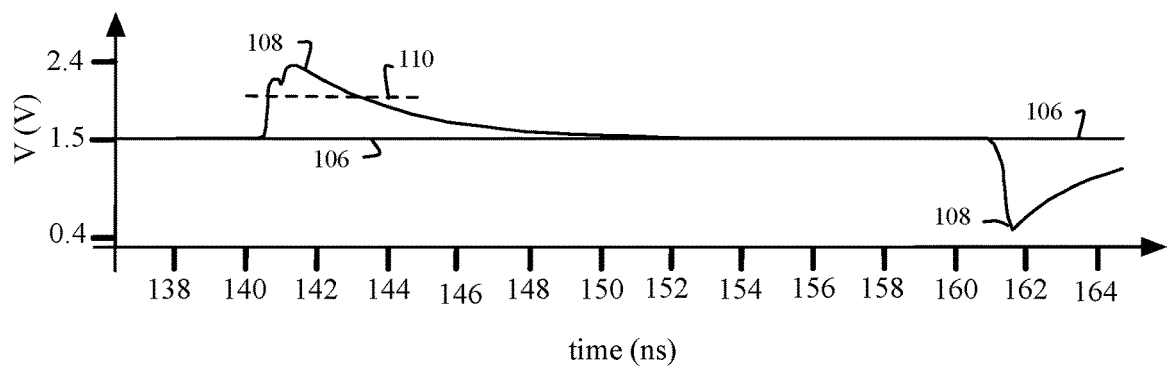
FIG. 5 is a graphical view of timing waveforms according to the embodiment of FIG. 3.

Referring now to FIG. 4 and FIG. 5, with continued reference to FIG. 1, FIG. 2 and FIG. 3, the operational timing of the high-speed voltage level translator is further explained. In FIG. 4, an input signal 100 has a positive voltage transition from 0 Volts to 1.5 Volts over the LV supply range at approximately 140 nanoseconds to 141 nanoseconds, and a negative voltage transition from 1.5 Volts to 0 Volts at approximately 160 nanoseconds to 161 nanoseconds. In response to the positive voltage transition of the input signal 100, an output 102 of the level translator using the traditional embodiment 10 of FIG. 1 shows a relatively slow slew rate and larger delay compared to an output 104 of the level translator using the new embodiment 20 of FIG. 2. Similarly, in response to the negative voltage transition of the input signal 100, an output 102 of the level translator using the traditional embodiment 10 of FIG. 1 shows a relatively slow slew rate and larger delay compared to an output 104 of the level translator using the new embodiment 20 of FIG. 2. In addition the transit delay for the output 102 through the level translator is longer than the transit delay for the output 104.

In FIG. 5, a bias voltage 106 is shown at 1.5 Volts. An intermediate voltage 108 is shown for the voltage driver of a new embodiment 20 having a positive voltage transition on the input 32. As a further example, in the embodiment 50, in response to a positive voltage transition on the node 66, the intermediate voltage 108 corresponds to the node 88b of the second voltage driver 62b. As seen from FIG. 5, the positive voltage transition on the input signal 100 boosts the intermediate voltage 108 to 2.4 volts above a drive voltage 110 for a minimum period sufficient to discharge the output 104 to below a minimum voltage (e.g., substantially 0 volts). Similarly, the negative voltage transition on the input signal 100 reduces the intermediate voltage 108 to 0.4 volts.

Referring to FIG. 2, FIG. 4 and FIG. 5 a time constant defined by the resistance of the bias device 36 and a capacitance of capacitor 40 is greater than a minimum time constant sufficient to ensure that the intermediate voltage 108 remains above the drive voltage 110 for long enough to slew the output signal 104 to below the minimum required voltage. Similarly, the time constant is less than a maximum time constant to ensure that the intermediate voltage 108 recovers (e.g., discharges or charges) to the bias voltage between a positive voltage transition and a negative voltage transition of the input signal 100. In the various embodiments of this disclosure the term "substantially" refers to a design value within the limits of typical manufacturing and environmental tolerance.

Figure 6:
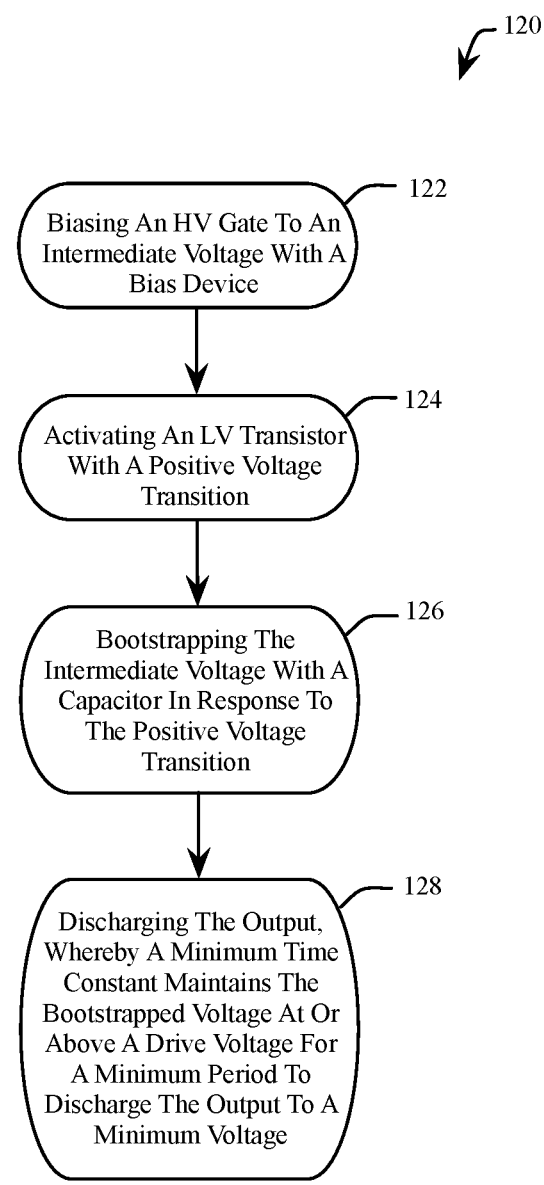
FIG. 6 is a flowchart representation of a method for high-speed voltage level translation in accordance with an example embodiment of the present disclosure.

FIG. 6 with reference to FIG. 2 and FIG. 5 shows a flowchart view of an embodiment of a method 120 for high-speed voltage level translation. At 122, an HV gate 34 is biased to an intermediate voltage with a bias device 36. At 124, an LV transistor 24 is activated with a positive voltage transition. At 126, the intermediate voltage is bootstrapped with a capacitor 40 in response to the positive voltage transition. At 128, the output 28 is discharged, wherein a minimum time constant maintains the bootstrapped voltage at or above a drive voltage 110 for a minimum period to discharge the output 28 to a minimum voltage.

As will be appreciated, embodiments as disclosed include at least the following. In one embodiment, a high-speed voltage level translator comprises a first P-channel Field Effect Transistor (PFET) comprising a first source connected to a high-voltage (HV) supply. A second PFET comprises a second source connected to the HV supply. The first PFET comprises a first drain connected to a second gate of the second PFET and a first driver output of the first voltage driver. The second PFET comprises a second drain connected to a first gate of the first PFET and a second driver output of a second voltage driver. A first input is connected to a first driver input of the first voltage driver and a second input is connected to a second driver input of the second voltage driver. Wherein, the second input has an opposite polarity of the first input and at least one of the first voltage driver and the second voltage driver comprises: a serially connected N-channel Field Effect Transistor (NFET) pair comprising a low-voltage (LV) transistor and an HV transistor, wherein an LV gate of the LV transistor is connected to a driver input, an HV drain of the HV transistor is connected to a driver output, a bias device is connected between a bias voltage and an HV gate of the HV transistor to generate an intermediate voltage on the HV gate, and a capacitor is connected between the LV gate and the HV gate, wherein the capacitor bootstraps the intermediate voltage to a bootstrapped voltage in response to a first voltage transition on the LV gate.

In another embodiment, a method for high-speed voltage level translation comprises biasing a high-voltage (HV) gate to an intermediate voltage with a bias device, wherein the intermediate voltage is within an HV voltage range of an HV transistor comprising the HV gate. A low-voltage (LV) transistor is activated with a positive voltage transition of a voltage pulse applied to an LV gate of the LV transistor, wherein the HV transistor is connected in series between an output and an LV drain of the LV transistor. The intermediate voltage is bootstrapped to a bootstrapped voltage in response to the positive voltage transition on the LV gate coupled to the HV gate through a capacitor connected therebetween. The output is discharged, wherein a time constant defined by a resistance of the bias device and a capacitance of the capacitor is greater than a minimum time constant, thereby maintaining the bootstrapped voltage on the HV gate at or above a drive voltage for a minimum period to discharge the output to a minimum voltage.

In another embodiment, a high-speed voltage level translator comprises a low-voltage (LV) transistor comprising an LV drain, an LV gate connected to an input, and an LV source connected to a ground, wherein the LV transistor is configured to operate over an LV voltage range of a voltage pulse applied to the input. A high-voltage (HV) transistor comprises an HV source connected to the LV drain, an HV gate, and an HV drain connected to an output, wherein the HV transistor is configured to operate over an HV voltage range, and an HV maximum voltage of the HV voltage range is larger than an LV maximum voltage of the LV voltage range. A bias device is connected between a bias voltage and the HV gate, wherein the bias voltage is configured to bias the HV gate to an intermediate voltage of the HV voltage range. A capacitor is connected between the LV gate and the HV gate. The capacitor is configured to bootstrap the intermediate voltage to a bootstrapped voltage in response to a positive voltage transition of the voltage pulse, wherein a time constant defined by a resistance of the bias device and a capacitance of the capacitor is greater than a minimum time constant, thereby maintaining the bootstrapped voltage on the HV gate at or above a drive voltage for a minimum period to discharge the output to a minimum voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A high-speed voltage level translator comprising:
a first P-channel Field Effect Transistor (PFET) comprising a first source connected to a high-voltage (HV) supply; and
a second PFET comprising a second source connected to the HV supply, the first PFET comprising a first drain connected to a second gate of the second PFET and a first driver output of a first voltage driver, the second PFET comprising a second drain connected to a first gate of the first PFET and a second driver output of a second voltage driver, a first input connected to a first driver input of the first voltage driver and a second input connected to a second driver input of the second voltage driver, wherein the second input has an opposite polarity of the first input and only one of the first voltage driver and the second voltage driver comprises:
a serially connected N-channel Field Effect Transistor (NFET) pair comprising a low-voltage (LV) transistor and an HV transistor, wherein an LV gate of the LV transistor is connected to a driver input, an HV drain of the HV transistor is connected to a driver output, a bias device is connected between a bias voltage and an HV gate of the HV transistor to generate an intermediate voltage on the HV gate, and a capacitor is connected between the LV gate and the HV gate, wherein the capacitor bootstraps the intermediate voltage to a bootstrapped voltage in response to a first voltage transition on the LV gate.

2. The high-speed voltage level translator of claim 1 wherein the first voltage transition is a positive voltage transition, and the intermediate voltage is bootstrapped at or above a drive voltage for a minimum period to discharge the output to a minimum voltage.

3. The high-speed voltage level translator of claim 2 wherein an activation of the LV transistor in response to the positive voltage transition maintains an LV drain voltage on the LV drain of the LV transistor below a breakdown voltage of the LV transistor while the intermediate voltage is bootstrapped to a bootstrapped voltage.

4. The high-speed voltage level translator of claim 1 wherein the first voltage transition is a negative voltage transition on the LV gate, thereby deactivating the respective LV transistor.

5. The high-speed voltage level translator of claim 1 wherein a time constant is defined by a resistance of the bias device and a capacitance of the capacitor, and the time constant is greater than a minimum time constant, thereby maintaining the bootstrapped voltage on the HV gate at a minimum voltage for a minimum period to discharge the output to a minimum voltage.

6. The high-speed voltage level translator of claim 1 wherein a time constant is defined by a resistance of the bias device and a capacitance of the capacitor, and the time constant is less than a maximum time constant, thereby discharging the bootstrapped voltage to the intermediate voltage before a negative voltage transition following the first voltage transition.

7. The high-speed voltage level translator of claim 1 wherein the bias device comprises a PFET comprising a gate biased to a ground.

8. The high-speed voltage level translator of claim 1 wherein the bias device comprises a resistor.

* * * * *